United States Patent
Kim et al.

(10) Patent No.: US 10,074,579 B1
(45) Date of Patent: Sep. 11, 2018

(54) STACKED SEMICONDUCTOR DEVICE

(71) Applicant: SK hynix Inc., Gyeonggi-do (KR)

(72) Inventors: Ji-Hwan Kim, Seoul (KR); Dong-Uk Lee, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/709,785

(22) Filed: Sep. 20, 2017

(30) Foreign Application Priority Data

Feb. 28, 2017 (KR) .......................... 10-2017-0026018

(51) Int. Cl.
*H01L 21/66* (2006.01)
*H01L 25/065* (2006.01)
*G01R 31/28* (2006.01)
*G01R 31/02* (2006.01)

(52) U.S. Cl.
CPC .......... *H01L 22/32* (2013.01); *G01R 31/2884* (2013.01); *H01L 25/0652* (2013.01); *G01R 31/024* (2013.01); *H01L 2225/06541* (2013.01)

(58) Field of Classification Search
CPC ................. H01L 22/32; H01L 25/0652; H01L 2225/06541; G01R 31/2884; G01R 31/024
See application file for complete search history.

(56) References Cited

U.S. PATENT DOCUMENTS

2013/0159587 A1* 6/2013 Nygren ................. G11C 5/063
710/306
2014/0340113 A1 11/2014 Tseng et al.

FOREIGN PATENT DOCUMENTS

KR 1020150119540 10/2015

* cited by examiner

*Primary Examiner* — Kyoung Lee
(74) *Attorney, Agent, or Firm* — IP & T Group LLP

(57) ABSTRACT

A stacked semiconductor device may include: a base die; and a plurality of core dies stacked over the base die, and suitable for communicating with allocated channels through a plurality of through-electrodes. Each of the core dies may include: a through-electrode scan unit enabled according to allocated channel information, and suitable for performing a down scan of transmitting a signal downward through through-electrodes connected in a column direction among the through-electrodes and an up scan of transmitting a signal upward through the through-electrodes connected in the column direction; and a defect detection unit suitable for detecting whether the through-electrodes have a defect, based on the down scan and the up scan.

20 Claims, 14 Drawing Sheets

STACKED SEMICONDUCTOR DEVICE

CROSS-REFERENCE TO RELATED APPLICATIONS

The present application claims priority of Korean Patent Application No. 10-2017-0026018, filed on Feb. 28, 2017, which is herein incorporated by reference in its entirety.

BACKGROUND

1. Field

Various embodiments relate to a semiconductor design technology, and more particularly, to a stacked semiconductor device with a multi-channel structure.

2. Description of the Related Art

With the rapid development of semiconductor technology, the packaging technology for semiconductor integrated devices has required high integration and high performance. Therefore, a variety of techniques for a three-dimensional (3D) structure in which a plurality of semiconductor chips are vertically stacked have been developed, in addition to a two-dimensional (2D) structure in which semiconductor chips having integrated circuits formed therein are two-dimensionally arranged on a printed circuit board (PCB) through wires or bumps.

Such a 3D structure can be implemented through a stacked semiconductor device in which a plurality of semiconductor chips are vertically stacked. The semiconductor chips stacked in the vertical direction may be mounted on a semiconductor package substrate while being electrically connected to each other through a plurality of through-electrodes, for example, through-silicon vias (TSVs).

In the TSVs, various types of defects may occur. The defects may include a void which occurs when a TSV is not completely filled with a conductive material, a bump contact fail which occurs when a chip is bent or a bump material is moved, and a crack of a TSV. Since the TSVs perform a function of electrically connecting the plurality of chips, the TSVs may not perform a normal function when the TSVs are open in the middle. Therefore, any potential defects of the TSVs need to be detected using a test.

SUMMARY

Various embodiments are directed to a stacked semiconductor device with a multi-channel structure, which is capable of verifying whether through-electrodes are operating normally, depending on channel information.

In an embodiment, a stacked semiconductor device may include: a base die; and a plurality of core dies stacked over the base die, and suitable for communicating with allocated channels through a plurality of through-electrodes. Each of the core dies may include: a through-electrode scan unit enabled according to allocated channel information, and suitable for performing a down scan of transmitting a downward signal and an up scan of transmitting an upward signal, to through-electrodes connected in a column direction among the through-electrodes; and a defect detection unit suitable for detecting whether the through-electrodes have a defect, based on the down scan and the up scan.

In an embodiment, there is provided a stacked semiconductor device including: a plurality of semiconductor chips stacked to transmit signals through a plurality of through-electrodes, and having one or more channels allocated thereto. Each of the semiconductor chips may include: an identification (ID) allocation unit suitable for generating an allocated chip ID signal according to an initial signal; and a test circuit suitable for generating an upper chip enable signal according to the chip ID signal and allocated channel information, performing a test on through-electrodes connected in a column direction among the through-electrodes in response to the upper chip enable signal, and detecting whether the through-electrodes have a defect.

DETAILED DESCRIPTION

Figure 1:
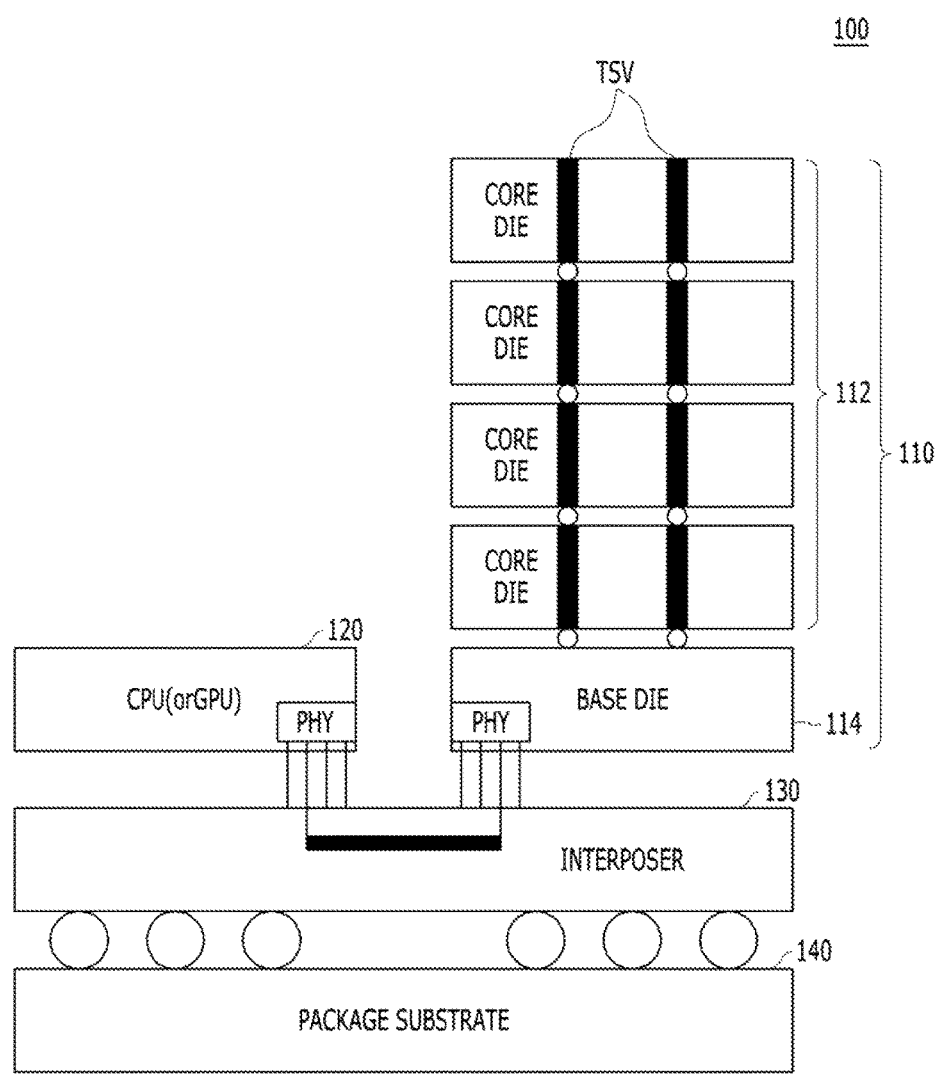
FIG. 1 is a diagram illustrating a semiconductor memory system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Hereafter, a semiconductor memory system will be described as an example of a stacked semiconductor device. A semiconductor memory system in accordance with an embodiment may be implemented in the form of a system-in-package (SIP) module, multi-chip-package (MCP) module or system-on-chip (SoC) module, or implemented in the form of a package-on-package (PoP) module including a plurality of packages.

FIG. 1 is a diagram illustrating a semiconductor memory system 100 in accordance with an embodiment of the present invention.

Referring to FIG. 1, the memory system 100 may include a stacked memory device 110, a memory controller 120, an interposer 130 and a package substrate 140.

The interposer 130 may be formed over the package substrate 140.

The stacked memory device 110 and the memory controller 120 may be formed over the interposer 130.

Physical regions PHY of the stacked memory device 110 and the memory controller 120 may be connected through the interposer 130.

The stacked memory device 110 may include a high bandwidth memory (HBM) in which a plurality of dies or chips are stacked and electrically connected through through-silicon vias (TSVs). The HBM can increase the number of input/output units, thereby raising the bandwidth.

The stacked memory device 110 may include a base die 114 and a plurality of core dies 112. The core dies 112 may be stacked over the base die 114, and connected to each other through a plurality of TSVs, for example, two TSVs as illustrated in FIG. 1. The TSVs will be referred to as through-electrodes.

The core die 112 may include a plurality of memory cells for storing data and circuits for core operations on the memory cells. The base die 114 may include circuits for interfacing the core dies 112 and the memory controller 120. Thus, the base die 114 may perform various functions in the semiconductor memory system, for example, a memory management function such as a power management or refresh function of the memory cells and a timing adjusting function between the core dies 112 and the memory controller 120.

The controller die 120 may be or include at least one of a central processing unit (CPU) die, a graphic process unit (GPU) die, a system on chip (SOC) die and the like.

Figure 2:
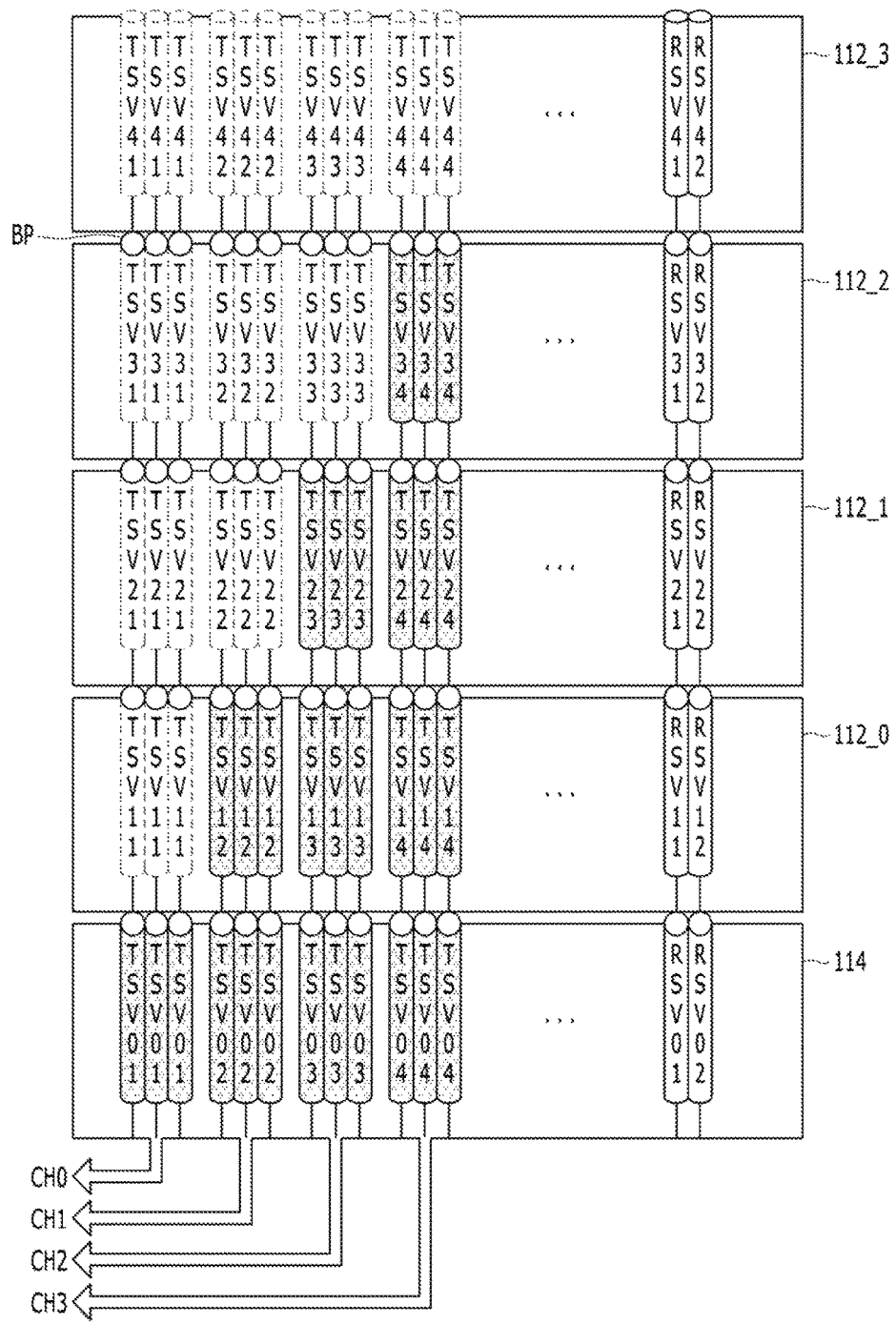
FIG. 2 is a diagram illustrating connections between dies and channels in a stacked memory device of FIG. 1.

FIG. 2 is a diagram illustrating connections between the dies and channels in the stacked memory device 110 of FIG. 1.

Referring to FIG. 2, the plurality of dies may include the base die 114 and the plurality of core dies 112_0 to 112_3. The plurality of dies may be connected in a column direction through a plurality of through-electrodes formed therein, in order to transmit signals. The through-electrodes formed in each of the dies may be connected to the through-electrodes formed in the upper or lower die through bump pads BP.

In the stacked memory device with a multi-channel structure, each of the core dies 112_0 to 112_3 can communicate with a specific channel depending on a position where the core die is stacked. For this structure, the plurality of through-electrodes formed through each of the core dies 112_0 to 112_3 may be grouped by a predetermined number of through-electrodes, and allocated to the respective channels. Each of the core dies 112_0 to 112_3 may communicate with a corresponding channel through the through-electrodes allocated to the corresponding channel and the base die 114. For example, the plurality of through-electrodes may be grouped into first-channel through-electrodes TVS01 to TSV41, second-channel through-electrodes TSV02 to TSV42, third-channel through-electrodes TSV03 to TSV43 and fourth-channel through-electrodes TSV04 to TSV44. When the first channel CH0 is allocated to the first core die 112_0, the first core die 112_0 may communicate with the first channel CH0 or an external device connected to the first channel CH0 through the first-channel through-electrodes TSV01 to TSV41. When the third channel CH2 is allocated to the third core die 112_2, the third core die 112_2 may communicate with the third channel CH2 or an external device connected to the third channel CH2 through the third-channel through-electrodes TSV03 to TSV43.

In the stacked memory device with a multi-channel structure, when a specific channel is selected, the corresponding core die may be enabled, and signals may be transmitted through the through-electrodes allocated to the specific channel. The through-electrodes, indicated by dotted lines, formed in the core dies stacked over the enabled core die may not be used. For example, when the second channel CH1 is selected, the corresponding second core die 112_1 may be enabled, and signals may be transmitted through the second-channel through-electrodes TSV02 to TSV12, but the through-electrodes TSV22 to TSV42 formed in the third and fourth core dies 112_2 and 112_3 may not be actually used. However, since all of the through-electrodes need to guarantee physical connections even though the through-electrodes are not actually used, all of the through-electrodes need to pass a test, for example, an open/short (OS) test. When defects are detected during the OS test which is performed on all through-electrodes connected in the column direction, through-electrodes having defects may be repaired by redundancy through-electrodes RTSV01 to RTSV42.

The number of through-electrodes which are not used may gradually increase toward the upper core dies. Since the OS test does not consider whether through-electrodes are actually used, the OS test cannot screen through-electrodes which are not actually used. Therefore, when a defective through-electrode is detected, the defective through-electrode may be unconditionally repaired. When a large number of defective through-electrodes exceeding the number of redundancy through-electrodes RTSV01 to RTSV42 are detected, the corresponding device may be considered and discarded as a fail device, even though the device has no problems in operation.

Hereafter, a method capable of raising the yield of the entire device by performing an OS test on through-electrodes in each core die based on channel information will be described.

Figure 3:
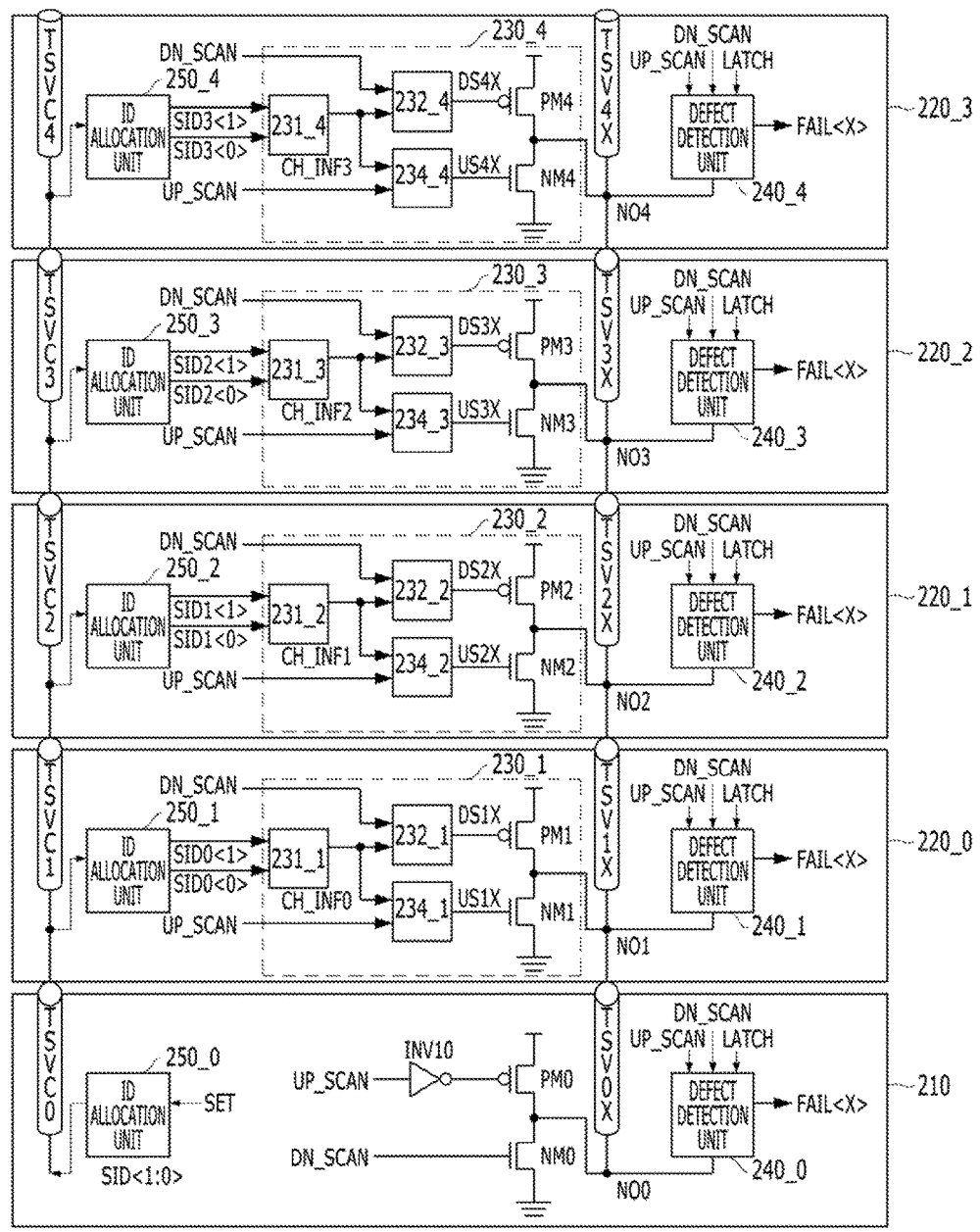
FIG. 3 is a diagram illustrating a stacked memory device in accordance with an embodiment of the present embodiment.

FIG. 3 is a diagram illustrating a stacked memory device in accordance with an embodiment of present embodiment. FIG. 3 illustrates components related to the present embodiment.

Referring to FIG. 3, the stacked memory device may include a base die 210 and a plurality of core dies 220_0 to 220_3 which are stacked over the base die 210 and communicate with channels allocated through a plurality of through-electrodes TSV0X to TSV4X. FIG. 3 illustrates the through-electrodes TSV0X to TSV4X connected as one in the column direction. In reality, however, a plurality of through-electrodes may be formed in each of the core dies 220_0 to 220_3 as illustrated in FIG. 2.

The first to fourth core dies 220_0 to 220_3 may include through-electrode scan units 230_1 to 230_4 and defect detection units 240_1 to 240_4, respectively.

The through-electrode scan units 230_1 to 230_4 may be enabled according to channel information allocated thereto, and perform a down scan and an up scan on the through-electrodes TSV0X to TSV4X connected in the column direction among the through-electrodes. The down scan may indicate transmitting a signal in the downward direction, and the up scan may indicate transmitting a signal in the upward direction. The defect detection units 240_1 to 240_4 may detect whether the through-electrodes TSV0X to TSV4X have defects, based on the down scan and the up scan.

The base die 210 and the first to fourth core dies 220_0 to 220_3 may include identification (ID) allocation units 250_0 to 250_4 for generating chip ID signals SID<0:3><1:0> for the respective core dies, during a boot-up operation or an initial operation. The ID allocation unit 250_0 of the base die 210 may generate an initial ID signal SID<1:0> having an initial value of '00' in response to a reset signal SET, and transmit the initial ID signal SID<1:0> to a separate through-electrode TSVC0. The ID allocation units 250_1 to 250_4 of the first to fourth core dies 220_0 to 220_3 may receive the initial ID signal SID<1:0> transmitted through separate through-electrodes TSVC0 to TSVC3 from the respective lower dies, and generate the chip ID signals SID<0:3><1:0> which sequentially increase. For example, the first core die 220_0 may generate the chip ID signal SID0<1:0> having the same value of '00' as the initial ID signal SID<1:0> of '00', the second core die 220_1 may generate the chip ID signal SID1<1:0> of '01' by increasing the chip ID signal SID0<1:0> of '00' by 1, the third core die 220_2 may generate the chip ID signal SID2<1:0> of '10' by increasing the initial ID signal SID<1:0> by 2, and the fourth core die 220_3 may generate the chip ID signal SID3<1:0> of '11' by increasing the initial ID signal SID<1:0> by 3. However, the present embodiment is not limited thereto, but the chip ID signals SID<0:3><1:0> by which the core dies 220_0 to 220_3 can be distinguished may be generated through various methods.

The through-electrode scan units 230_1 to 230_4 may include upper chip recognition units 231_1 to 231_4, down scan units 232_1 to 232_4 and PM1 to PM4, and up scan units 234_1 to 234_4 and NM1 to NM4, respectively.

The upper chip recognition units 231_1 to 231_4 may generate upper chip enable signals CH_INF0 to CH_INF3 by decoding the chip ID signals SID<0:3><1:0> according to channel information allocated thereto.

The down scan units 232_1 to 232_4 and PM1 to PM4 may be enabled according to the upper chip enable signals CH_INF0 to CH_INF3, and perform a down scan by flowing a current downward through the through-electrodes TSV0X to TSV4X connected in the column direction. The down scan units 232_1 to 232_4 and PM1 to PM4 may include down scan control units 232_1 to 232_4 and current source units PM1 to PM4, respectively. The down scan control units 232_1 to 232_4 may selectively activate a global down scan signal DN_SCAN to and output local down scan signals DS1X to DS4X, in response to the upper chip enable signals CH_INF0 to CH_INF3, respectively. The current source units PM1 to PM4 may provide a current source to one terminal NO1 to NO4 of the through-electrodes TSV1X to TSV4X in response to the respective local down scan signals DS1X to DS4X. For reference, since the local down scan signals DS1X to DS4X are signals for driving the current source units PM1 to PM4 implemented with PMOS transistors, the local down scan signals DS1X to DS4X may be activated to a logic low level.

The up scan units 234_1 to 234_4 and NM1 to NM4 may be enabled according to the upper chip enable signals CH_INF0 to CH_INF3, and perform an up scan by flowing a current upward through the through-electrodes TSV0X to TSV4X connected in the column direction. The up scan units 234_1 to 234_4 and NM1 to NM4 may include up scan control units 234_1 to 234_4 and current sink units NM1 to NM4, respectively. The up scan control units 234_1 to 234_4 may selectively activate a global up scan signal UP_SCAN to output local up scan signals US1X to US4X, in response to the upper chip enable signals CH_INF0 to CH_INF3, respectively. The current sink units NM1 to NM4 may sink signals transmitted through the terminals NO1 to NO4 of the through-electrodes TSV1X to TSV4X in response to the respective local up scan signals US1X to US4X. For reference, since the local up scan signals US1X to US4X are signals for driving the current sink units NM1 to NM4 implemented with NMOS transistors, the local up scan signals US1X to US4X may be activated to a logic high level.

The defect detection unit 240_1 to 240_4 may store a down scan result as a first value according to the global down scan signal DN_SCAN and a latch signal LAT, store an up scan result as a second value according to the global up scan signal UP_SCAN and the latch signal LAT, and combine the stored first and second values to generate a fail determination signal FAIL<X> indicating whether the through-electrodes TSV0X to TSV4X have a defect.

The base die 210 may include a current sink unit NM0 and a current source unit PM0. The current sink unit NM0 may sink a signal transmitted in the downward direction through one terminal NO0 of the through-electrode TSV0X in response to the global down scan signal DN_SCAN, and the current source unit PM0 may provide a current source of a signal transmitted in the upward direction to the terminal NO0 of the through-electrode TSV0X in response to the global up scan signal UP_SCAN. For reference, since the global down scan signal DN_SCAN and the global up scan signal UP_SCAN are activated to a logic high level, the base die 210 may include an inverter INV10 for driving the current source unit PM0 implemented with a PMOS transistor by inverting the global up scan signal UP_SCAN. The base die 210 may include a defect detection unit 240_0 having the same configuration as each of the defect detection units 240_1 to 240_4 of the first to fourth core dies 220_0 to 220_3.

In the present embodiment, the stacked memory device may decode the chip ID signals SID<0:3><1:0> of the corresponding core dies according to the channel information, and enable only the through-electrode scan unit of the uppermost chip when a specific channel is used. Therefore, only through-electrodes which are actually used during a down scan and an up scan can be tested to remove repair operations caused by defects of through-electrodes and bump pads which are not actually used. Therefore, the yield of the whole semiconductor devices can be increased.

Figure 4A:
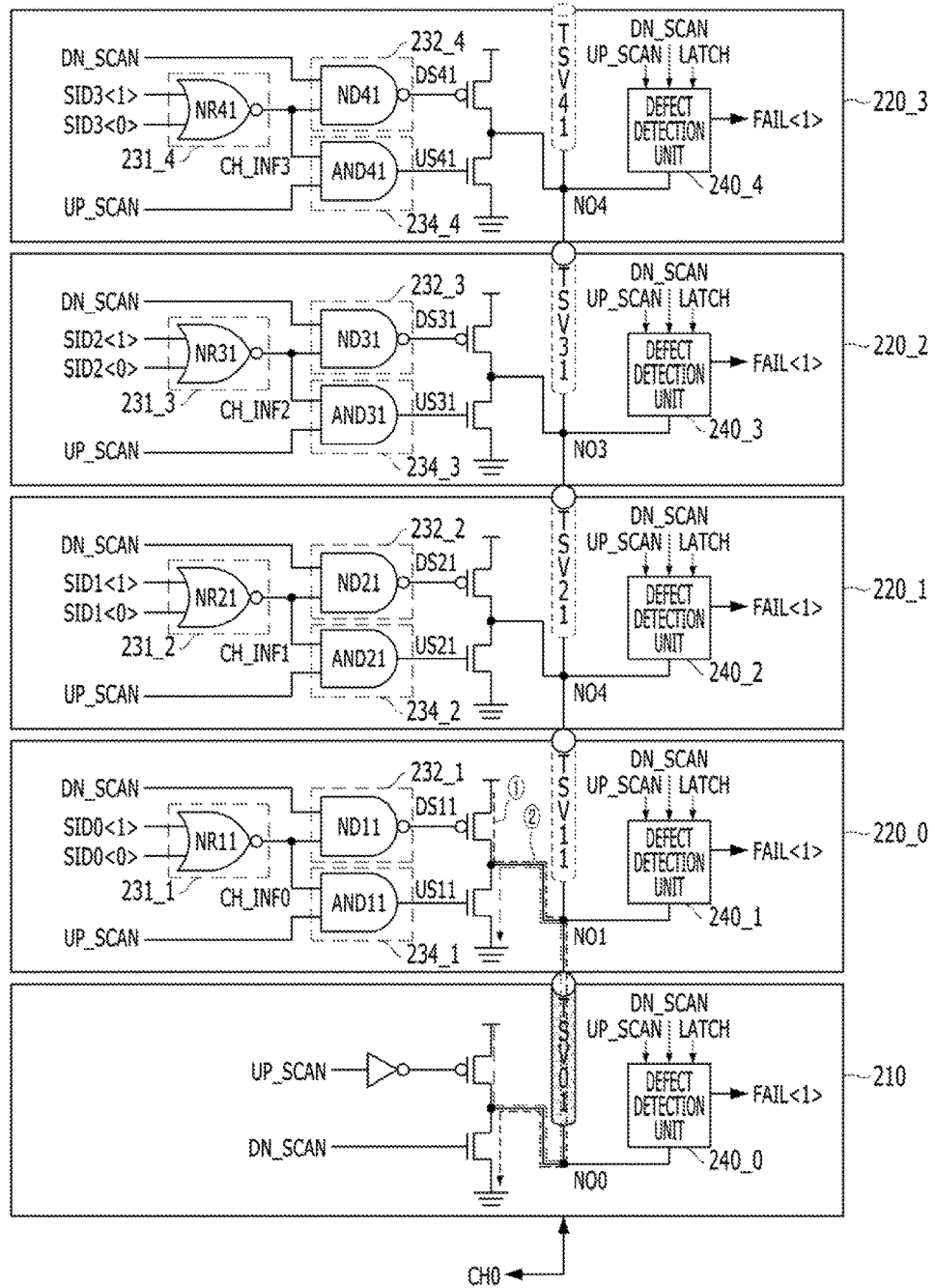
FIGS. 4A to 4D are diagrams for describing scan operations on through-electrodes for respective channels and configurations of through-electrode scan units in the stacked memory device of FIG. 3.
Figure 4B:
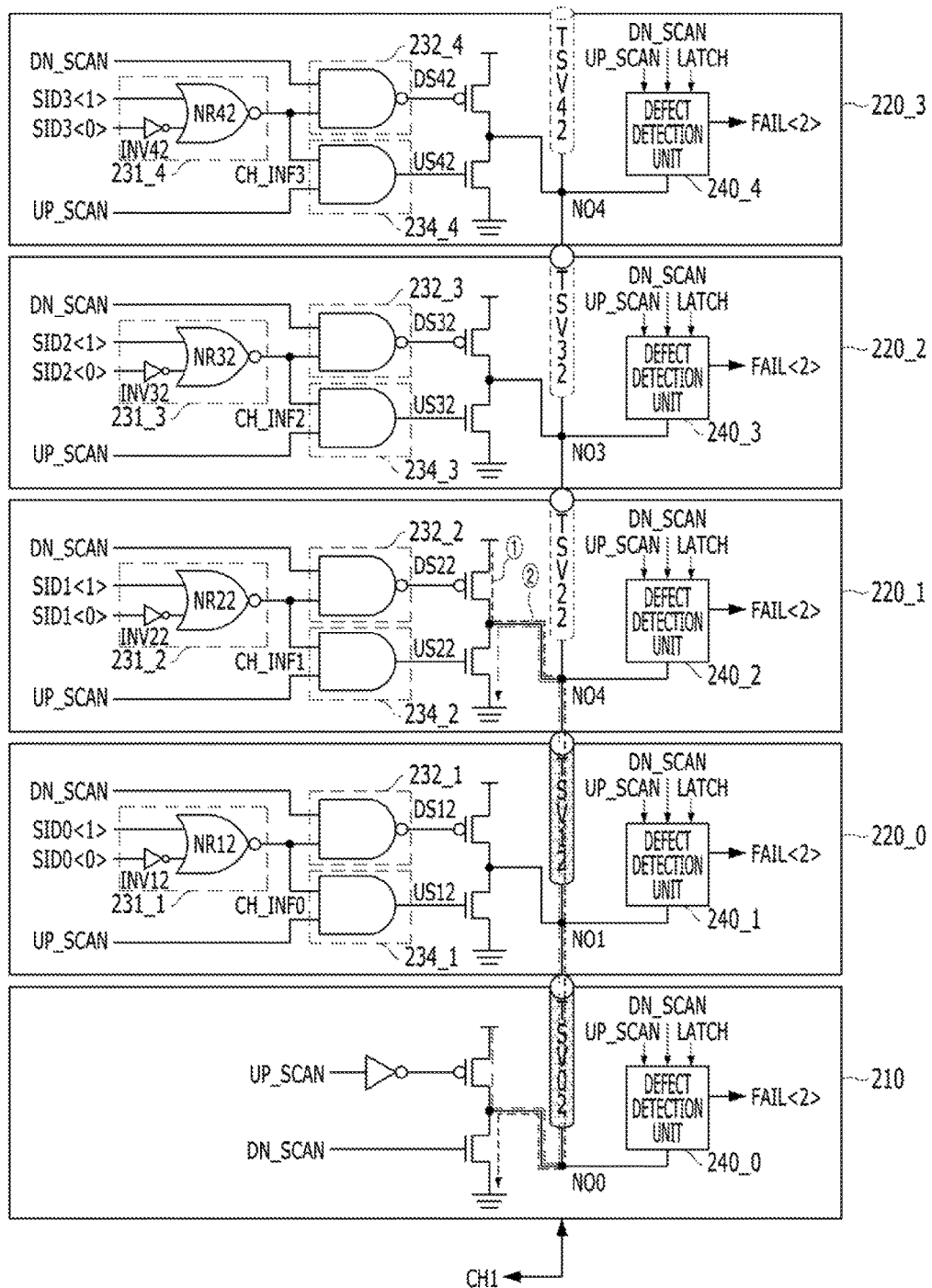
Figure 4C:
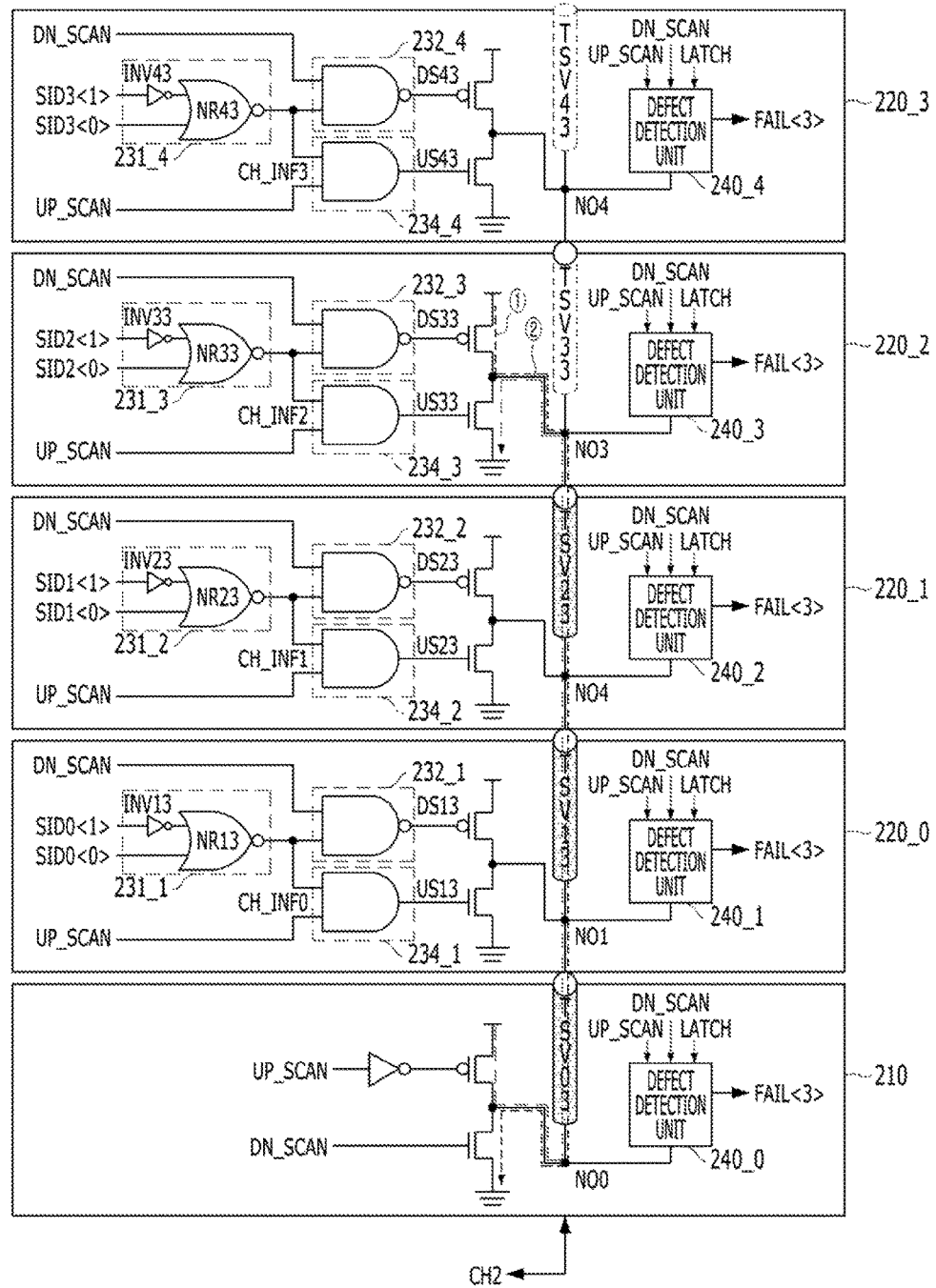
Figure 4D:
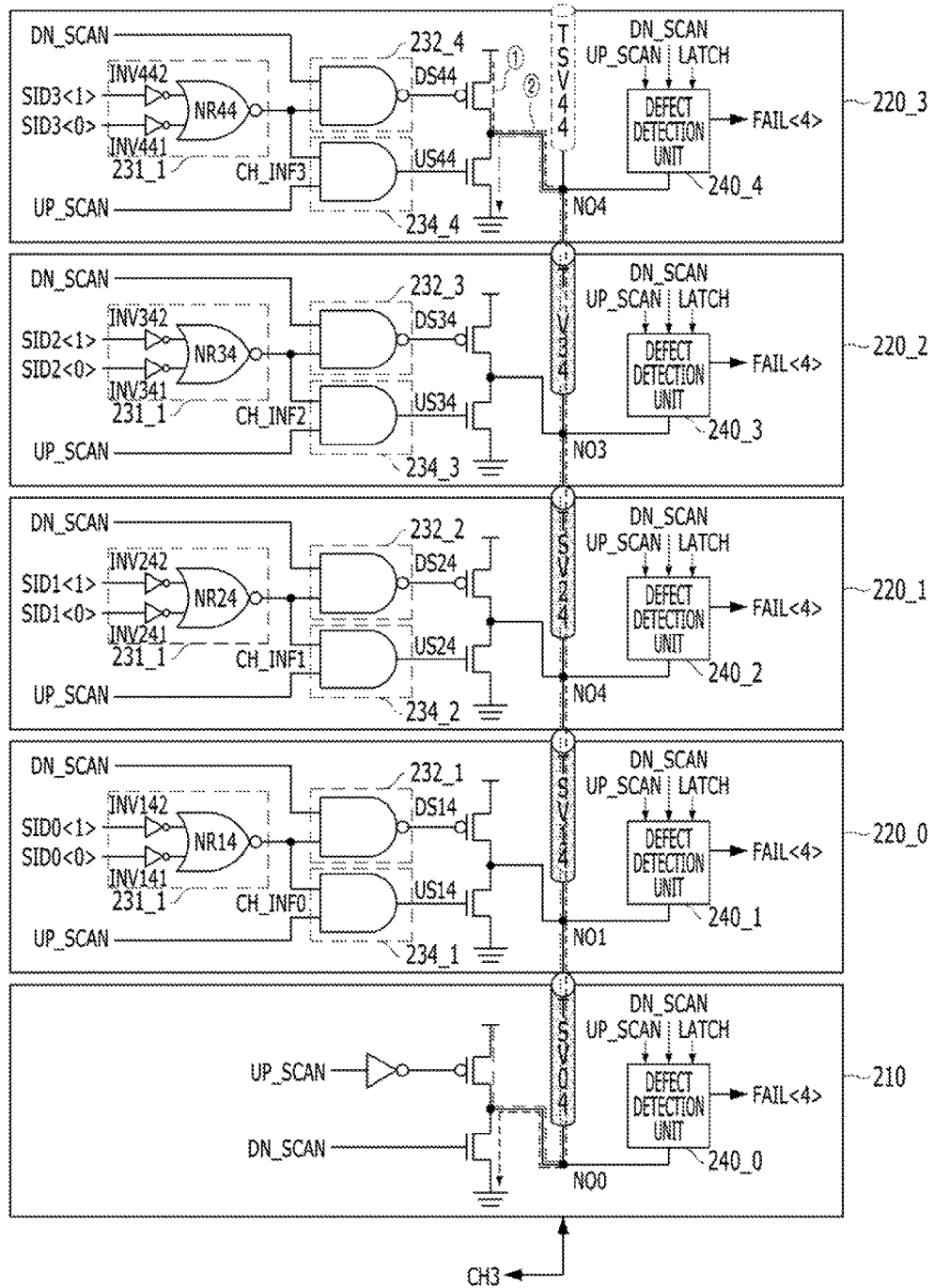

FIGS. 4A to 4D are diagrams for describing scan operations on the through-electrodes for the respective channels and configurations of the through-electrode scan units 230_1 to 230_4 in the stacked memory device of FIG. 3. In FIGS. 3 to 4D, the same components will be represented by like reference numerals. The ID allocation units 250_0 to 250_4 of FIG. 3 are omitted in FIGS. 4A to 4D for convenience of description.

FIG. 4A illustrates a scan operation on the through-electrodes TSV01 to TSV41 for the first channel CH0.

Referring to FIG. 4A, the upper chip recognition units 231_1 to 231_4 of the through-electrode scan units (230_1 to 230_4 of FIG. 3) may include NOR gates NR11 to NR41 which perform a NOR operation on the respective chip ID signals SID<0:3><1:0> to output the upper chip enable signals CH_INF0 to CH_INF3, respectively. The down scan control units 232_1 to 232_4 may include NAND gates ND11 to ND41 which perform a NAND operation on the upper chip enable signals CH_INF0 to CH_INF3 and the global down scan signal DN_SCAN to output the local down scan signals DS11 to DS41, respectively. The up scan control units 234_1 to 234_4 may include AND gates AND11 to 0AND41 which perform an AND operation on the upper chip enable signals CH_INF0 to CH_INF3 and the global up scan signal UP_SCAN to output the local up scan signals US11 to US41, respectively.

Therefore, the upper chip recognition unit 231_1 of the first core die 220_0 may receive the chip ID signal SID0<1:0> that is, '00' of the first core die 220_0 corresponding to the first channel CH0, and generate the upper chip enable signal CH_INF0 which is activated to a logic high level. When the global down scan signal DN_SCAN or the global up scan signal UP_SCAN is activated to a logic high level, the down scan unit or the up scan unit of the first core die 220_0 may perform a down scan ① or an up scan ② on the through-electrode TSV01. Alternately, the upper chip recognition units 231_2 to 231_4 of the other second to fourth core dies 220_1 to 220_3 may generate the upper chip enable signals CH_INF1 to CH_INF3 which are deactivated to a logic low level. Thus, the down scan units and the up scan units of the second to fourth core dies 220_1 to 220_3 may not operate even though the global down scan signal DN_SCAN or the global up scan signal UP_SCAN is activated.

Therefore, during the scan operation on the through-electrodes TSV01 to TSV41 for the first channel CH0, only the through-electrode TSV01 which is actually used may be tested through an OS test. Thus, since repair operations caused by defects of the bump pads and the through-electrodes TSV11 to TSV41 which are not actually used can be removed, the yield of the whole semiconductor devices can be increased.

FIG. 4B illustrates a scan operation on the through-electrodes TSV02 to TSV42 for the second channel CH1.

Referring to FIG. 4B, the through-electrode scan units may have substantially the same configuration as FIG. 4A, except for the upper chip recognition units 231_1 to 231_4. The upper chip recognition units 231_1 to 231_4 of FIG. 4B may include inverters INV12 to INV42 and NOR gates NR12 to NR42, respectively. The inverters INV12 to INV42 may invert first bits SID<0:3><0> of the chip ID signals SID<0:3><1:0>, and the NOR gates NR12 to NR42 may perform a NOR operation on output signals of the inverters INV12 to INV42 and second bits SID<0:3><1> of the chip ID signals SID<0:3><1:0> to output the upper chip enable signals CH_INF0 to CH_INF3, respectively.

Therefore, the upper chip recognition unit 231_2 of the second core die 220_1 may receive the chip ID signal SID1<1:0> that is, '01', of the second core die 220_1 corresponding to the second channel CH1, and generate the upper chip enable signal CH_INF1 which is activated to a logic high level. When the global down scan signal DN_SCAN or the global up scan signal UP_SCAN is activated to a logic high level, the down scan unit or the up scan unit of the second core die 220_1 may perform a down scan ① or an up scan ② on the through-electrodes TSV02 and TSV12. Thus, during the scan operation on the through-electrodes TSV02 to TSV42 for the second channel CH1, only the through-electrodes TSV02 and TSV12 which are actually used may be tested through an OS test.

FIG. 4C illustrates a scan operation on the through-electrodes TSV03 to TSV43 for the third channel CH2.

Referring to FIG. 4C, the through-electrode scan units may have substantially the same configuration as FIG. 4A, except for the upper chip recognition units 231_1 to 231_4. The upper chip recognition units 231_1 to 231_4 of FIG. 4C may include inverters INV13 to INV43 and NOR gates NR13 to NR43, respectively. The inverters INV13 to INV43 may invert second bits SID<0:3><1> of the chip ID signals SID<0:3><1:0>, and the NOR gates NR13 to NR43 may perform a NOR operation on output signals of the inverters INV13 to INV43 and first bits SID<0:3><0> of the chip ID signals SID<0:3><1:0> to output the upper chip enable signals CH_INF0 to CH_INF3, respectively.

Therefore, the upper chip recognition unit 231_3 of the third core die 220_2 may receive the chip ID signal SID2<1:0> that is, '10', of the third core die 220_2 corresponding to the third channel CH2, and generate the upper chip enable signal CH_INF2 which is activated to a logic high level. When the global down scan signal DN_SCAN or the global up scan signal UP_SCAN is activated to a logic high level, the down scan unit or the up scan unit of the third core die 220_2 may perform a down scan ① or an up scan ② on the through-electrodes TSV03 to TSV23. Thus, during the scan operation on the through-electrodes TSV03 to TSV43 for the third channel CH2, only the through-electrodes TSV03 to TSV23 which are actually used may be tested through an OS test.

FIG. 4D illustrates a scan operation on the through-electrodes TSV04 to TSV44 for the fourth channel CH3.

Referring to FIG. 4D, the through-electrode scan units may have substantially the same configuration as FIG. 4A, except for the upper chip recognition units 231_1 to 231_4. The upper chip recognition units 231_1 to 231_4 of FIG. 4D may include first inverters INV141 to INV441, second inverters INV142 to INV442, and NOR gates NR14 to NR44, respectively. The first inverters INV141 to INV441 may invert first bits SID<0:3><0> of the chip ID signals SID<0:3><1:0>, the second inverters INV142 to INV442 may invert second bits SID<0:3><1> of the chip ID signals SID<0:3><1:0>, and the NOR gates NR14 to NR44 may perform a NOR operation on output signals of the first inverters INV141 to INV441 and output signals of the second inverters INV142 to INV442 to output the upper chip enable signals CH_INF0 to CH_INF3, respectively.

Therefore, the upper chip recognition unit 231_4 of the fourth core die 220_3 may receive the chip ID signal SID2<1:0> that is, '11', of the fourth core die 220_3 corresponding to the fourth channel CH3, and generate the upper chip enable signal CH_INF3 which is activated to a logic high level. When the global down scan signal DN_SCAN or the global up scan signal UP_SCAN is activated to a logic high level, the down scan unit or the up scan unit of the fourth core die 220_3 may perform a down scan ① or an up scan ② on the through-electrodes TSV04 to TSV34. Thus, during the scan operation on the through-electrodes TSV04 to TSV44 for the fourth channel CH3, only the through-electrodes TSV04 to TSV34 which are actually used may be tested through an OS test.

Figure 5:
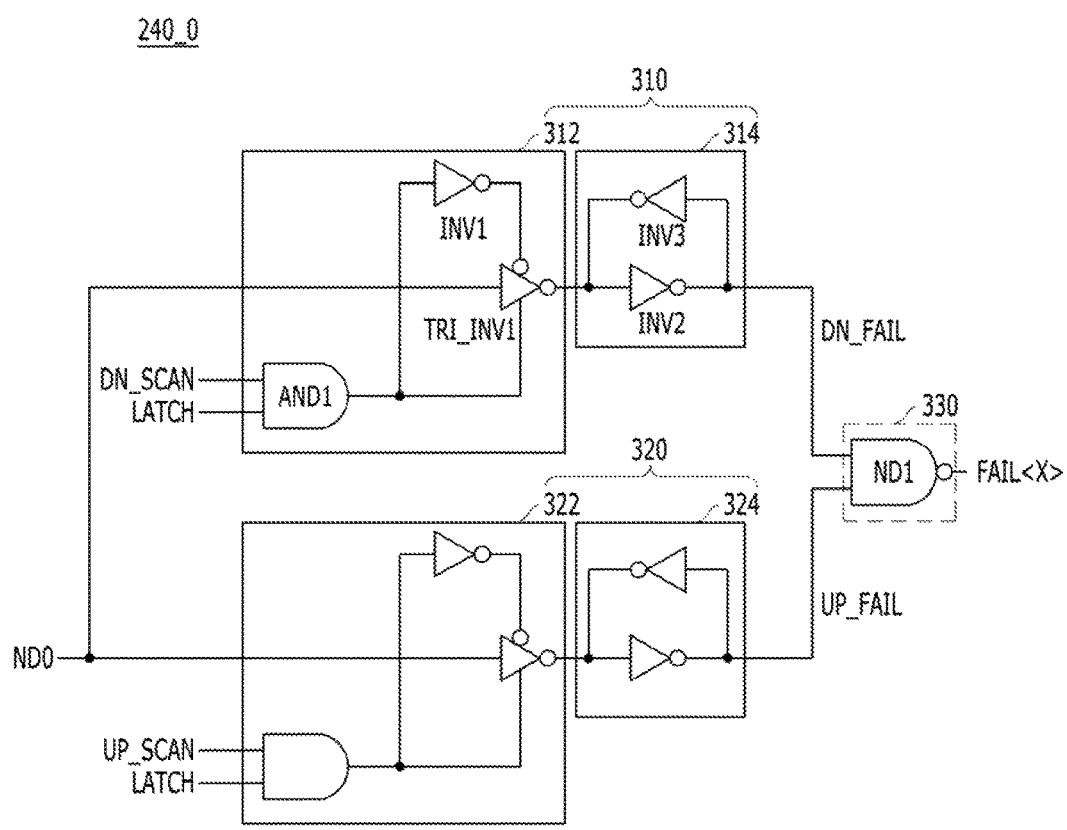
FIG. 5 is a circuit diagram illustrating a defect detection unit of a base die in FIG. 3.

FIG. 5 is a circuit diagram illustrating the defect detection unit 240_0 of the base die 210 of FIG. 3. For reference, the defect detection units 240_1 to 240_4 included in the first to fourth core dies 220_0 to 220_3 of FIG. 3 may have substantially the same configuration as the defect detection unit 240_0 of FIG. 5.

Referring to FIG. 5, the defect detection unit 240_0 may include a down scan storage unit 310, an up scan storage unit 320 and a signal generation unit 330.

The down scan storage unit 310 may store a down scan result as a first value DN_FAIL, according to the global down scan signal DN_SCAN and the latch signal LATCH.

The down scan storage unit 310 may include a first signal transmission unit 312 and a first latch unit 314. The first signal transmission unit 312 may transmit a signal outputted from one terminal NO0 of the through-electrode TSV0X according to the global down scan signal DN_SCAN and the latch signal LATCH, and the first latch unit 314 may store a signal outputted from the first signal transmission unit 312 as the first value DN_FAIL.

For example, the first signal transmission unit 312 may include a first AND gate AND1, a first inverter INV1 and a first three-phase inverter TRI_INV1. The first AND gate AND1 may perform an AND operation on the global down scan signal DN_SCAN and the latch signal LATCH. The first inverter INV1 may invert an output of the first AND gate AND1. The first three-phase inverter TRI_INV1 may be enabled according to an output of the first AND gate AND1 and an output of the first inverter INV1, and invert a signal transmitted through the terminal NO0 of the through-electrode TSV0X. The first latch unit 314 may include cross-coupled inverters INV2 and INV3. According to the above-described configuration, the down scan storage unit 310 may store the signal outputted from the terminal NO0 of the through-electrode TSV0X as the first value DN_FAIL, when both the global down scan signal DN_SCAN and the latch signal LATCH are activated.

The up scan storage unit 320 may store an up scan result as a second value UP_FAIL, according to the global up scan signal UP_SCAN and the latch signal LATCH. The up scan storage unit 320 may include a second signal transmission unit 322 and a second latch unit 324. The second signal transmission unit 322 may transmit a signal outputted from the terminal NO0 of the through-electrode TSV0X according to the global up scan signal UP_SCAN and the latch signal LATCH, and the second latch unit 324 may store a signal outputted from the second signal transmission unit 322 as the second value UP_FAIL. The second signal transmission unit 322 and the second latch unit 324 may have substantially the same configuration as the first signal transmission unit 312 and the first latch unit 314. According to the above-described configuration, the up scan storage unit 320 may store the signal outputted from the terminal NO0 of the through-electrode TSV0X as the second value UP_FAIL, when both the global up scan signal UP_SCAN and the latch signal LATCH are activated.

The signal generation unit 330 may generate a fail determination signal FAIL<X> by combining the first value DN_FAIL stored in the down scan storage unit 310 and the second value UP_FAIL stored in the up scan storage unit 320. For example, the signal generation unit 330 may include a NAND gate ND1 which performs a NAND operation on the first and second values DN_FAIL and UP_FAIL to output the fail determination signal FAIL<X>.

Hereafter, referring to FIGS. 2 to 6B, an operation of the stacked memory device in accordance with the present embodiment will be described.

Figure 6A:
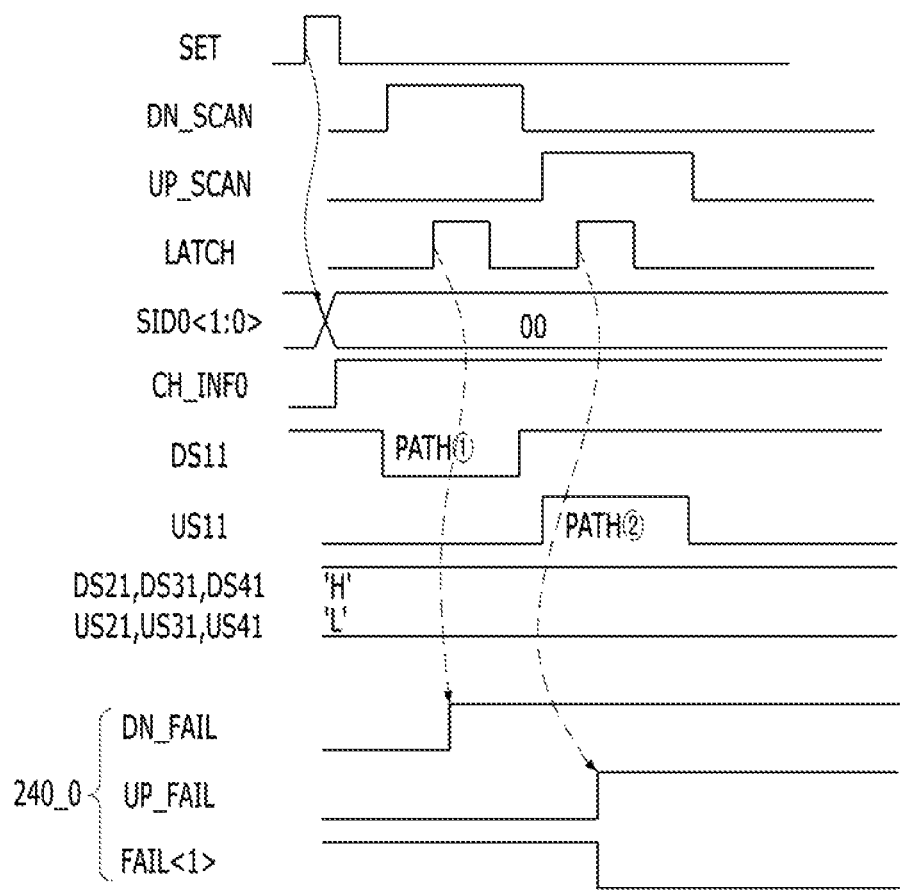
FIGS. 6A and 6B are timing diagrams for describing an operation of the stacked memory device of FIG. 3.
Figure 6B:
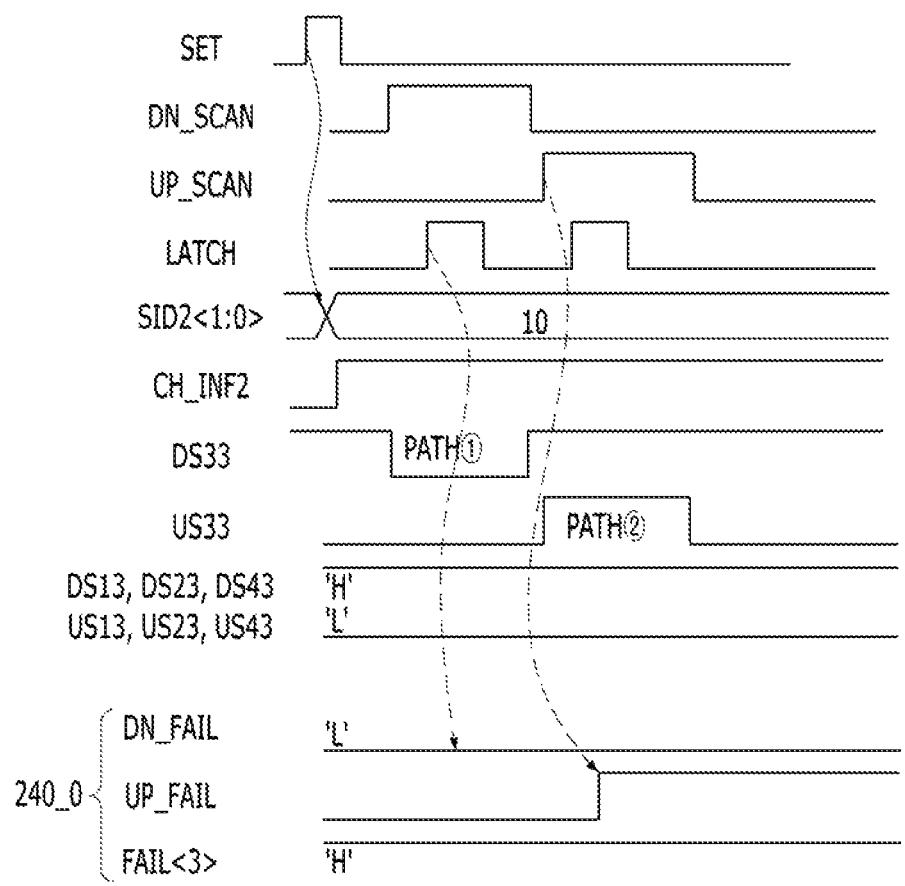

FIGS. 6A and 6B are timing diagrams for describing an operation of the stacked memory device of FIG. 3.

FIG. 6A is a timing diagram for describing a scan operation on the through-electrodes TSV01 to TSV41 for the first channel CH0 of FIG. 4A. At this time, suppose that the through-electrode TSV01 which is actually used has no defects.

Referring to FIG. 6A, when the reset signal SET is activated, the ID allocation units 250_1 to 250_4 of the first to fourth core dies 220_0 to 220_3 may generate the chip ID signals SID<0:3><1:0> which are distinguished from each other.

The upper chip recognition unit 231_1 of the first core die 220_0 may receive the chip ID signal SID0<1:0> that is, '00', of the first core die 220_0 corresponding to the first channel CH0, and generate the upper chip enable signal CH_INF0 which is activated to a logic high level.

When the global down scan signal DN_SCAN is activated, the down scan control unit 232_1 of the first core die 220_0 may activate the local down scan signal DS11 to a logic low level in response to the upper chip enable signal CH_INF0, and the current source unit PM1 may provide a current source to one terminal NO1 of the through-electrode TSV11 in response to the local down scan signal DS11. Furthermore, the current sink unit NM0 of the base die 210 may sink a signal transmitted in the downward direction through one terminal NO0 of the through-electrode TSV01 in response to the global down scan signal DN_SCAN. Thus, a down scan ① for the through-electrode TSV01 may be performed. At this time, since the through-electrode TSV01 has no defects, the defect detection unit 240_0 of the base die 210 may store a high-level signal transmitted through the terminal NO0 of the through-electrode TSV01 as the first value DN_FAIL, according to the global down scan signal DN_SCAN and the latch signal LATCH.

When the global up scan signal UP_SCAN is activated, the current source unit PM0 of the base die 210 may provide a current source of a signal transmitted in the upward direction to the terminal NO0 of the through-electrode TSV01 in response to the global up scan signal UP_SCAN. Furthermore, the up scan control unit 234_1 of the first core die 220_0 may activate the local up scan signal US11 in response to the upper chip enable signal CH_INF0, and the current sink unit NM1 may sink a signal transmitted through the terminal NO1 of the through-electrode TSV11 in response to the local up scan signal US11. Thus, an up scan ② for the through-electrode TSV01 may be performed. At this time, since the through-electrode TSV01 has no defects, the defect detection unit 240_0 of the base die 210 may store a high-level signal transmitted through the terminal NO0 of the through-electrode TSV01 as the second value UP_FAIL, according to the global up scan signal UP_SCAN and the latch signal LATCH.

Finally, the defect detection unit 240_0 may generate a fail determination signal FAIL<1> at a logic low level, based on the first and second values DN_FAIL and UP_FAIL at a logic high level. A test device (not illustrated) or a memory controller (not illustrated) may determine that the actually used through-electrode TSV01 has no defects, based on the low-level fail determination signal FAIL<1>.

In the second to fourth core dies 220_1 to 220_3, the local down scan signals DS21 to DS41 and the local up scan signals US21 to US41 may not be activated according to the upper chip enable signals CH_INF1 to CH_INF3 which are deactivated to a logic low level, even though the global down scan signal DN_SCAN and the global up scan signal UP_SCAN are activated. Therefore, the down scan units and the up scan units of the second to fourth core dies 220_1 to 220_3 may not operate.

FIG. 6B is a timing diagram for describing a scan operation on the through-electrodes TSV03 to TSV43 for the third channel CH2 of FIG. 4C. As an example, one through-electrode TSV13 among the through-electrodes TSV03 to TSV23 which are actually used, has a defect.

Referring to FIG. 6B, when the reset signal SET is activated and the chip ID signals SID<0:3><1:0> are generated, the upper chip recognition unit 231_3 of the third core die 220_2 may receive the chip ID signal SID2<1:0> that is, '10', of the third core die 220_2 corresponding to the third channel CH2, and generate the upper chip enable signal CH_INF2 which is activated to a logic high level.

When the global down scan signal DN_SCAN is activated, the down scan control unit 232_3 of the third core die 220_2 may activate the local down scan signal DS33 to a logic low level in response to the upper chip enable signal CH_INF2, and the current source unit PM3 may provide a current source to one terminal NO3 of the through-electrode TSV33 in response to the local down scan signal DS33. Thus, a down scan ① for the through-electrodes TSV03 to TSV23 may be performed. At this time, since the through-electrode TSV13 has a defect, the current source does not transferred to the terminal NO0 of the through-electrode TSV03. Accordingly, the defect detection unit 240_0 may store a low-level signal of the terminal NO0 of the through-electrode TSV03 as the first value DN_FAIL, according to the global down scan signal DN_SCAN and the latch signal LATCH.

When the global up scan signal UP_SCAN is activated, the up scan control unit 234_3 of the third core die 220_2 may activate the local up scan signal US33 in response to the upper chip enable signal CH_INF0, and the current sink unit NM3 may sink the signal transmitted through the terminal NO3 of the through-electrode TSV33 in response to the local up scan signal US33. Thus, an up scan ② for the through-electrodes TSV03 to TSV23 may be performed. The defect detection unit 240_0 may store a high-level signal transmitted through the terminal NO0 of the through-electrode TSV03 as the second value UP_FAIL, according to the global up scan signal UP_SCAN and the latch signal LATCH.

Finally, the defect detection unit 240_0 may generate a fail determination signal FAIL<3> at a logic high level, based on the first value DN_FAIL of the low level and the high-level second value UP_FAIL of the high level. The test device (not illustrated) or the memory controller (not illustrated) may determine that the through-electrodes TSV03 to TSV23 which are actually used have a defect, based on the high-level fail determination signal FAIL<3>.

In the remaining core dies 220_0, 220_1, and 220_3, the local down scan signals DS13, DS23 and DS43 and the local up scan signals US13, US23 and US43 may not be activated according to the upper chip enable signals CH_INF1, CH_INF2 and CH_INF4 which are deactivated to a logic low level, even though the global down scan signal DN_SCAN and the global up scan signal UP_SCAN are activated. Therefore, the down scan units and the up scan units of the remaining core dies 220_0, 220_1, and 220_3 may not operate.

The stacked memory device in accordance with the present embodiment can test only a through-electrode which is actually used among the through-electrodes which are physically connected, and determine whether the through-electrode has a defect. In the following embodiment, a method capable of not only determining whether an actually-used through-electrode has a defect, but also determining where a defect occurred among the through-electrodes included in the core dies will be described.

Figure 7:
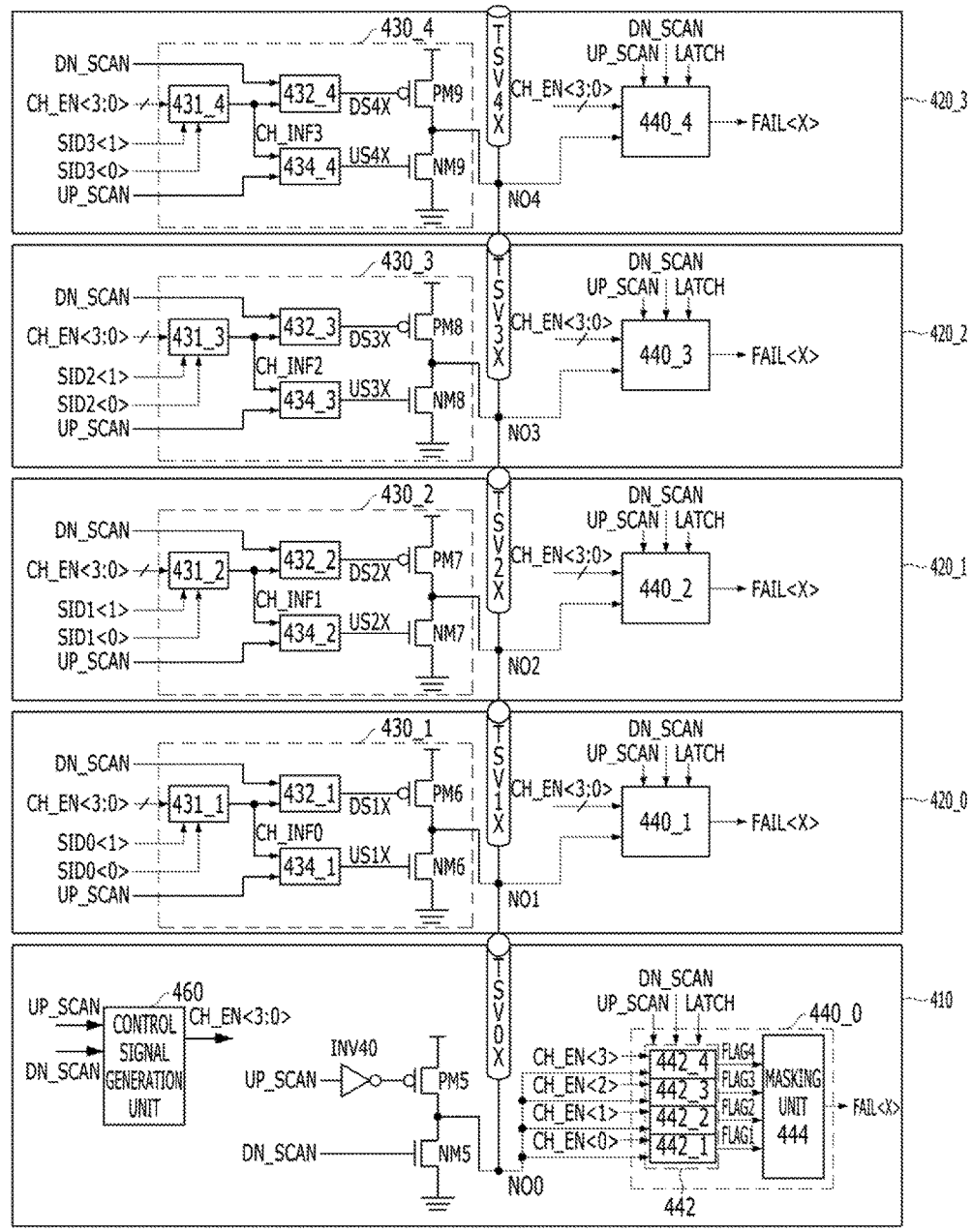
FIG. 7 is a diagram illustrating a stacked memory device in accordance with an embodiment of the present invention.
Figure 8:
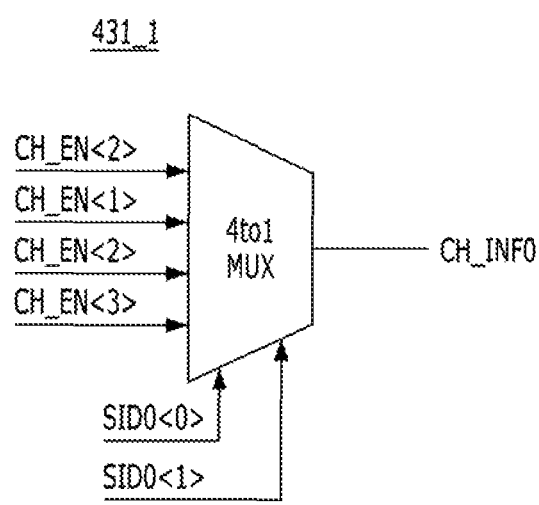
FIG. 8 is a detailed diagram illustrating an upper chip recognition unit of FIG. 7.

FIG. 7 is a diagram illustrating a stacked memory device in accordance with an embodiment of the present invention. FIG. 8 is a detailed diagram illustrating an upper chip recognition unit 431_1 of a first core die 420_0 in FIG. 7.

Referring to FIG. 7, the stacked memory device may include a base die 410 and a plurality of core dies 420_0 to 420_3 which are stacked over the base die 410 and communicate with a channel allocated through a plurality of through-electrodes TSV0X to TSV4X. For convenience of description, FIG. 7 illustrates the through-electrodes TSV0X to TSV4X connected as one in the column direction. In reality, however, a plurality of through-electrodes may be installed in each of the core dies 420_0 to 420_3 as illustrated in FIG. 2.

The first to fourth core dies 420_0 to 420_3 may include through-electrode scan units 430_1 to 430_4 and defect detection units 440_1 to 440_4, respectively.

The through-electrode scan units 430_1 to 430_4 may be enabled according to channel information allocated thereto, and perform a down scan and an up scan on the through-electrodes TSV0X to TSV4X connected in the column direction among the through-electrodes. The down scan may indicate transmitting a signal in the downward direction, and the up scan may indicate transmitting a signal in the upward direction.

The through-electrode scan units 430_1 to 430_4 may include upper chip recognition units 431_1 to 431_4, down scan units 432_1 to 432_4 and PM6 to PM9, and up scan units 434_1 to 434_4 and NM6 to NM9, respectively.

The upper chip recognition units 431_1 to 431_4 may select one of a plurality of channel enable signals CH_EN<3:0> which are sequentially activated, according to chip ID signals SID<0:3><1:0>, and generate upper chip enable signals CH_INF0 to CH_INF3, respectively. The number of channel enable signals CH_EN<3:0> may correspond to the number of the first to fourth core dies 420_0 to 420_3. Referring to FIG. 8, each of the upper chip recognition units 431_1 to 431_4 may include a 4-to-1 multiplexer MUX which selects one of four input signals, and outputs the selected signals as one of the upper chip enable signals CH_INF0 to CH_INF3.

The down scan units 432_1 to 432_4 and PM6 to PM9 may be enabled according to the upper chip enable signals CH_INF0 to CH_INF3, and perform a down scan by flowing a current downward through the through-electrodes TSV0X to TSV4X connected in the column direction. The down scan units 432_1 to 432_4 and PM6 to PM9 may include down scan control units 432_1 to 432_4 and current source units PM6 to PM9, respectively. Since the down scan units of FIG. 7 has substantially the same configuration as the down scan units of FIG. 3, the detailed descriptions thereof are omitted herein.

The up scan units 434_1 to 434_4 and NM6 to NM9 may be enabled according to the upper chip enable signals CH_INF0 to CH_INF3, and perform an up scan by flowing a current upward through the through-electrodes TSV0X to TSV4X connected in the column direction. The up scan units 434_1 to 434_4 and NM6 to NM9 may include up scan control units 434_1 to 434_4 and current sink units NM6 to NM9, respectively. Since the up scan units of FIG. 7 has substantially the same configuration as the up scan units of FIG. 3, the detailed descriptions thereof are omitted herein.

Although not illustrated, the base die 410 and the first to fourth core dies 420_0 to 420_3 may include identification (ID) allocation units that generate the chip ID signals SID<0:3><1:0> for the respective core dies, during a boot-up operation or initial operation. Since the ID allocation units have substantially the same configuration as the ID allocation units 250_0 to 250_4 of FIG. 3, the detailed descriptions thereof are omitted herein.

The base die 410 may include a current sink unit NMS5 and a current source unit PM5. The current sink unit NM5 may sink a signal transmitted in the downward direction through one terminal NO0 of the through-electrode TSV0X during a down scan, in response to the global down scan signal DN_SCAN, and the current source unit PM5 may provide a current source of a signal transmitted in the upward direction to the terminal NO0 of the through-electrode TSV0X during an up scan, in response to the global up scan signal UP_SCAN. For reference, since the global down scan signal DN_SCAN and the global up scan signal UP_SCAN are activated to a logic high level, the base die 210 may include an inverter INV40 for driving the current source unit PM5 implemented with a PMOS transistor by inverting the global up scan signal UP_SCAN. Furthermore, the base die 410 may include a defect detection unit 440_0 having the same configuration as the defect detection units 440_1 to 440_4 of the first to fourth core dies 420_0 to 420_3.

Each of the defect detection units 440_0 to 440_4 of the stacked semiconductor device illustrated in FIG. 7 may include a detection unit 442 and a masking unit 444, respectively. For example, the detection unit 442 442 includes first to fourth sub defect detection units 442_1 to 442_4 corresponding to the first to fourth core dies 420_0 to 420_3.

The first to fourth sub defect detection units 442_1 to 442_4 may be sequentially enabled according to the first to fourth channel enable signals CH_EN<3:0>, detect whether the through-electrodes TSV0X to TSV4X have a defect based on the down scan and the up scan, and generate first to fourth fail determination flags FLAG1 to FLAG4. The masking unit 444 may mask the first to fourth fail determination flags FLAG1 to FLAG4 in response to a mask signal (CH_MSK<3:0> of FIG. 9) which is preset in the mask unit 444 according to the channel information, and output a fail determination signal FAIL<X> indicating whether the through-electrodes TSV0X to TSV4X have a defect.

The base die 410 may further include a control signal generation unit 460 configured to generate the first to fourth channel enable signals CH_EN<3:0> which are sequentially activated, according to the global down scan signal DN_SCAN and the global up scan signal UP_SCAN.

Figure 9:
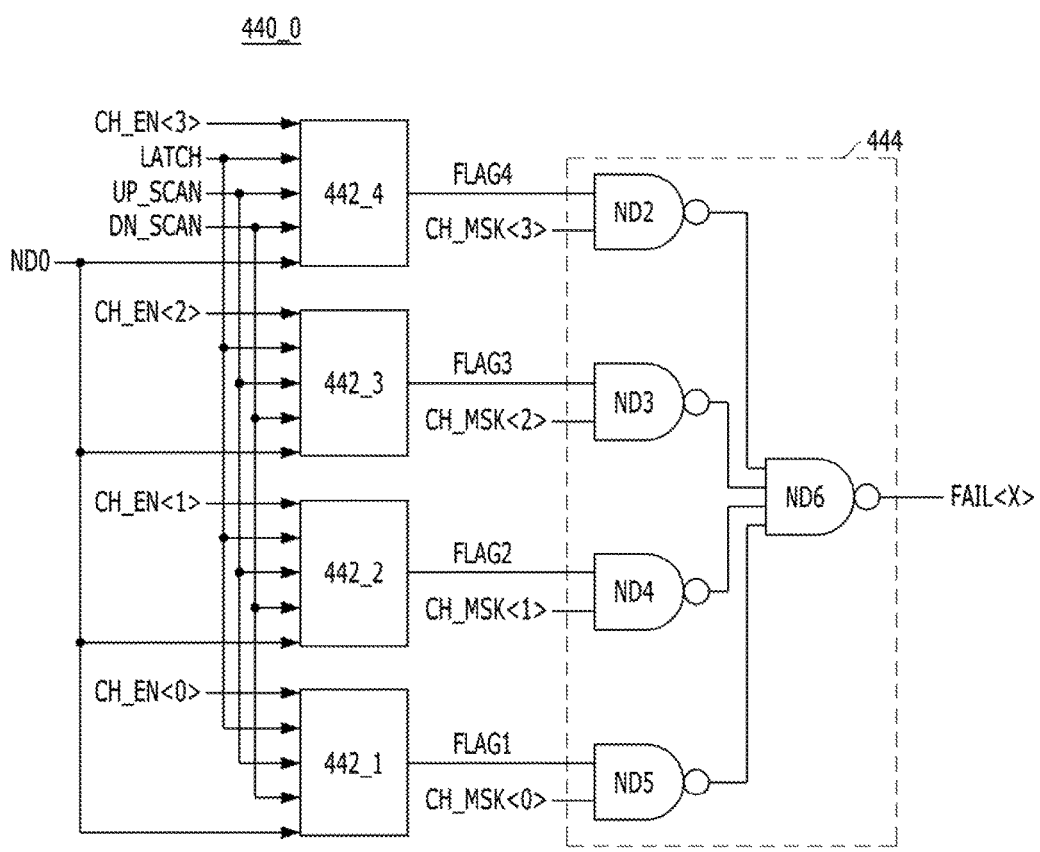
FIG. 9 is a circuit diagram illustrating a defect detection unit of a base die in FIG. 7.

FIG. 9 is a circuit diagram illustrating the defect detection unit 440_0 of the base die 410 of FIG. 7. The defect detection units 440_1 to 440_4 included in the first to fourth core dies 420_0 to 420_3 of FIG. 7 may have substantially the same configuration as the defect detection unit 440_0 of FIG. 9.

Referring to FIG. 9, the first sub defect detection unit 442_1 may be enabled according to the first channel enable signal CH_EN<0>, store a down scan result transmitted through one terminal NO0 of the through-electrode TSV0X as a first value according to the global down scan signal DN_SCAN and the latch signal LAT, store an up scan result transmitted through the terminal NO0 of the through-electrode TSV0X as a second value according to the global up scan signal UP_SCAN and the latch signal LAT, and combine the stored first and second values to generate and store the first fail determination flag FLAG1 indicating whether the through-electrodes TSV0X to TSV4X have a defect. Similarly, the second to fourth sub defect detection units 442_2 to 442_4 may be sequentially enabled according to the second to fourth channel enable signals CH_EN<3:1>, and generate and store the second to fourth fail determination flags FLAG2 to FLAG4. Therefore, a test device (not illustrated) or memory controller (not illustrated) can extract the first to fourth fail determination flags FLAG1 to FLAG4 stored in the first to fourth sub defect detection units 442_1 to 442_4, and recognize where a defect occurred among the through-electrodes included the core dies.

The first to fourth sub defect detection units 442_1 to 442_4 may have substantially the same configuration as the defect detection unit 240_0 of FIG. 5, except that the first to fourth sub defect detection units 442_1 to 442_4 are sequentially enabled according to the first to fourth channel enable signals CH_EN<3:0>.

The masking unit 444 may include first to fifth NAND gates ND2 to ND6. The first to fourth NAND gates ND2 to ND6 may perform a NAND operation on the respective bits of the mask signal CH_MSK<3:0> and the first to fourth fail determination flags FLAG1 to FLAG4, respectively, and the fifth NAND gate ND6 may perform a NAND operation on outputs of the first to fourth NAND gates ND2 to ND5 and output the fail determination signal FAIL<X>. That is, the masking unit 444 may output the fail determination flags FLAG1 to FLAG4 corresponding to the respective bits of the mask signal CH_MSK<3:0> having a logic high level as the fail determination signal FAIL<X>.

At this time, the mask signal CH_MSK<3:0> may be preset in the masking unit 444 according to the channel information, and configured as described in Table 1 below. For example, in the case of the through-electrode for the first channel CH0, the mask signal CH_MSK<3:0> may be preset to '0001', and the masking unit 444 may output the first fail determination flag FLAG1 stored in the first sub defect determination unit 442_1 as the fail determination signal FAIL<X>.

TABLE 1

|  | CH_MSK<3> | CH_MSK<2> | CH_MSK<1> | CH_MSK<0> |
| --- | --- | --- | --- | --- |
| TSV for CH0 | L | L | L | H |
| TSV for CH1 | L | L | H | L |
| TSV for CH2 | L | H | L | L |
| TSV for CH3 | H | L | L | L |

Figure 10A:
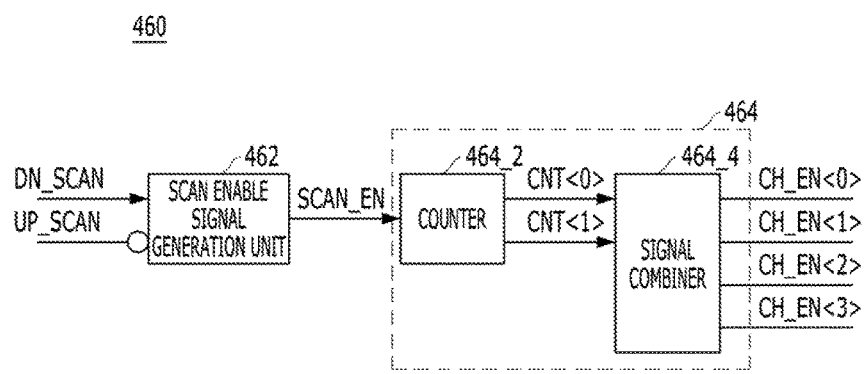
FIG. 10A is a block diagram illustrating a control signal generation unit of FIG. 7.

FIG. 10A is a block diagram illustrating the control signal generation unit 460 of FIG. 7.

Referring to FIG. 10A, the control signal generation unit 460 may include a scan enable signal generation unit 462 and a counting unit 464.

The scan enable signal generation unit 462 may generate a scan enable signal SCAN_EN which is activated according to the global down scan signal DN_SCAN and deactivated according to the global up scan signal UP_SCAN. The counting unit 464 may perform a counting operation on the scan enable signal SCAN_EN, and generate the first to fourth channel enable signals CH_EN<3:0> which are sequentially activated.

The counting unit 464 may include a counter 464_2 and a signal combiner 464_4.

The counter 464_2 may generate first and second count signals CNT<1:0> by counting the scan enable signal SCAN_EN. The signal combiner 464_4 may generate the first to fourth channel enable signals CH_EN<3:0> by combining logic levels of the first and second count signals CNT<1:0>.

Figure 10B:
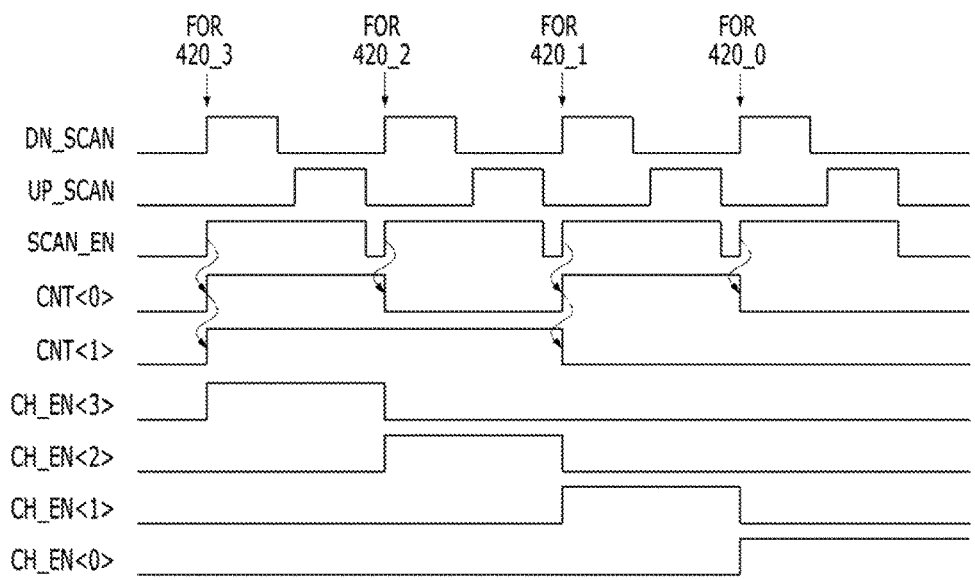
FIG. 10B is a timing diagram for describing an operation of the control signal generation unit of FIG. 10A.

FIG. 10B is a timing diagram for describing an operation of the control signal generation unit 460 of FIG. 7.

Referring to FIG. 10B, the scan enable signal generation unit 462 may generate the scan enable signal SCAN_EN which is activated in response to a rising edge of the global down scan signal DN_SCAN and deactivated in response to a falling edge of the global up scan signal UP_SCAN.

The counter 464_2 may generate first and second count signals CNT<1:0> by counting the scan enable signal SCAN_EN. The signal combiner 464_4 may generate the first to fourth channel enable signals CH_EN<3:0> by combining the logic levels of the first and second count signals CNT<1:0>.

Therefore, the control signal generation unit 460 may generate the first to fourth channel enable signals CH_EN<3:0> which are sequentially activated, whenever the global down scan signal DN_SCAN and the global up scan signal UP_SCAN are inputted.

The stacked semiconductor device in accordance with the present embodiment may sequentially perform a down scan and an up scan between the first to fourth core dies 420_0 to 420_3 and the base die 410 in response to the first to fourth channel enable signals CH_EN<3:0> which are sequentially activated. For example, when the fourth core die 420_3 is selected in response to the fourth channel enable signal CH_EN<3>, the stacked semiconductor device may perform a down scan and an up scan on the through-electrodes TSV0X to TSV3X which are actually used, and store the scan results in the fourth sub defect detection unit 442_4 as the fourth fail determination flag FLAG4. Then, when the third core die 420_2 is selected in response to the third channel enable signal CH_EN<2>, the stacked semiconductor device may perform a down scan and an up scan on the through-electrodes TSV0X to TSV2X which are actually used, and store the scan results in the third sub defect detection unit 442_3 as the third fail determination flag FLAG3. In this way, the stacked semiconductor device may sequentially and repeatedly perform a down scan and an up scan on the through-electrodes TSV0X to TSV3X, TSV0X to TSV2X, TSV0X and TSV1X, and TSV0X, which are actually used when the respective core dies are selected, and store the fail determination flags FLAG1 to FLAG4 detected for the respective core dies in the plurality of sub defect detection units 442_1 to 442_4. Therefore, the stacked semiconductor device may extract the stored values and recognize where a defect occurred among the through-electrodes included in the core dies. Furthermore, the stacked semiconductor device may extract a target value among the stored values according to the channel information, and mask the other values, thereby recognizing whether actually-used through electrodes have a defect.

In accordance with the present embodiment, the stacked semiconductor device can reflect defect information of the through-electrodes according to the channel information of the stacked chips, thereby improving the whole chip yield.

Although various embodiments have been described for illustrative purposes, it will be apparent to those skilled in the art that various changes and modifications may be made without departing from the spirit and scope of the invention as defined in the following claims.

What is claimed is:

1. A stacked semiconductor device comprising:
    a base die; and
    a plurality of core dies stacked over the base die, and suitable for communicating with allocated channels through a plurality of through-electrodes,
    wherein each of the core dies comprises:
        a through-electrode scan unit enabled according to allocated channel information, and suitable for performing a down scan of transmitting a downward signal and an up scan of transmitting an upward signal, to through-electrodes connected in a column direction among the through-electrodes; and
        a defect detection unit suitable for detecting whether the through-electrodes have a defect, based on the down scan and the up scan.

2. The stacked semiconductor device of claim 1, wherein the through-electrodes formed through the respective core dies are grouped by a predetermined number and allocated to each of the channels, and each of the core dies communicates with a corresponding channel through the through-electrodes allocated to the corresponding channel and the base die.

3. The stacked semiconductor device of claim 1, wherein each of the core dies further comprises:
    an ID allocation unit suitable for generating a chip identification (ID) signal for each of the core dies based on an initial ID signal inputted from the base die.

4. The stacked semiconductor device of claim 3, wherein the through-electrode scan unit generates an upper chip enable signal by decoding the chip ID signal according to the allocated channel information, and performs the down scan and the up scan in response to the upper chip enable signal.

5. The stacked semiconductor device of claim 1, wherein the base die comprises:
    a current sink unit suitable for sinking the downward signal transmitted through the through-electrodes during the down scan, in response to a global down scan signal; and
    a current source unit suitable for providing a current source of the upward signal transmitted to the through-electrodes during the up scan, in response to a global up scan signal.

6. The stacked semiconductor device of claim 1, wherein the through-electrode scan unit comprises:
    an upper chip recognition unit suitable for generating an upper chip enable signal by decoding a chip identification (ID) signal according to the allocated channel information;
    a down scan unit enabled according to the upper chip enable signal, and suitable for performing the down scan by flowing a current downward through the through-electrodes connected in the column direction; and
    an up scan unit enabled according to the upper chip enable signal, and suitable for performing the up scan by flowing a current upward through the through-electrodes connected in the column direction.

7. The stacked semiconductor device of claim 6, wherein the down scan unit comprises:
    a down scan control unit suitable for selectively activating a global down scan signal to output a local down scan signal in response to the upper chip enable signal; and
    a current source unit suitable for providing a current source to one terminal of the through-electrode in response to the local down scan signal.

8. The stacked semiconductor device of claim 6, wherein the up scan unit comprises:
    an up scan control unit suitable for selectively activating a global up scan signal to output a local up scan signal in response to the upper chip enable signal; and
    a current sink unit suitable for sinking a signal transmitted through one terminal of the through-electrode in response to the local up scan signal.

9. The stacked semiconductor device of claim 1, wherein the defect detection unit comprises:
    a down scan storage unit suitable for storing a result of the down scan as a first value according to a global down scan signal and a latch signal;
    an up scan storage unit suitable for storing a result of the up scan as a second value according to a global up scan signal and the latch signal; and
    a signal generation unit suitable for combining the first and second values to generate a fail determination signal indicating whether the through-electrodes have a defect.

10. The stacked semiconductor device of claim 1, wherein the through-electrode scan unit comprises:
- an upper chip recognition unit suitable for generating an upper chip enable signal by selecting one of a plurality of channel enable signals which are sequentially activated, according to a chip identification (ID) signal;
- a down scan unit enabled according to the upper chip enable signal, and suitable for performing the down scan by flowing a current downward through the through-electrodes connected in the column direction; and
- an up scan unit enabled according to the upper chip enable signal, and suitable for performing the up scan by flowing a current upward through the through-electrodes connected in the column direction.

11. The stacked semiconductor device of claim 10, wherein the defect detection unit comprises:
- a plurality of sub defect detection units corresponding to the plurality of core dies, sequentially enabled according to the plurality of channel enable signals, and suitable for generating and storing a plurality of fail determination flags by detecting whether the through-electrodes have a defect, based on the down scan and the up scan; and
- a masking unit suitable for masking the plurality of fail determination flags according to the allocated channel information, and outputting a fail determination signal.

12. The stacked semiconductor device of claim 11, wherein each of the sub defect detection units comprises:
- a down scan storage unit suitable for storing a result of the down scan as a first value according to an allocated signal among the plurality of channel enable signals, a global down scan signal, and a latch signal;
- an up scan storage unit suitable for storing a result of the up scan as a second value according to the allocated channel enable signal, a global up scan signal and the latch signal; and
- a signal generation unit suitable for generating the fail determination flag by combining the first and second values.

13. The stacked semiconductor device of claim 10, further comprising:
- a control signal generation unit suitable for generating the plurality of channel enable signals which are sequentially activated according to a global down scan signal and a global up scan signal.

14. The stacked semiconductor device of claim 13, wherein the control signal generation unit comprises:
- a scan enable signal generation unit suitable for generating a scan enable signal which is activated according to the global down scan signal, and deactivated according to the global up scan signal; and
- a counting unit suitable for performing a counting operation on the scan enable signal, and generating the plurality of channel enable signals which are sequentially activated.

15. A stacked semiconductor device comprising:
- a plurality of semiconductor chips stacked to transmit signals through a plurality of through-electrodes, and having one or more channels allocated thereto,
- wherein each of the semiconductor chips comprises:
  - an identification (ID) allocation unit suitable for generating a chip ID signal according to an initial signal; and
  - a test circuit suitable for generating an upper chip enable signal according to the chip ID signal and allocated channel information, performing a test on through-electrodes connected in a column direction among the through-electrodes in response to the upper chip enable signal, and detecting whether the through-electrodes have a defect.

16. The stacked semiconductor device of claim 15, wherein the test circuit comprises:
- a through-electrode scan unit suitable for performing a down scan of transmitting a downward signal and an up scan of transmitting an upward signal, to the through-electrodes connected in the column direction, in response to the upper chip enable signal; and
- a defect detection unit suitable for detecting whether the through-electrodes have a defect, based on the down scan and the up scan.

17. The stacked semiconductor device of claim 16, wherein the through-electrode scan unit comprises:
- an upper chip recognition unit suitable for generating the upper chip enable signal by decoding the chip ID signal according to the allocated channel information;
- a down scan unit enabled according to the upper chip enable signal, and suitable for performing the down scan by flowing a current downward through the through-electrodes connected in the column direction; and
- an up scan unit enabled according to the upper chip enable signal, and suitable for performing the up scan by flowing a current upward through the through-electrodes connected in the column direction.

18. The stacked semiconductor device of claim 16, wherein the defect detection unit comprises:
- a down scan storage unit suitable for storing a result of the down scan as a first value according to a global down scan signal and a latch signal;
- an up scan storage unit suitable for storing a result of the up scan as a second value according to a global up scan signal and the latch signal; and
- a signal generation unit suitable for combining the first and second values to generate a fail determination signal indicating whether the through-electrodes have a defect.

19. The stacked semiconductor device of claim 16, wherein the through-electrode scan unit comprises:
- an upper chip recognition unit suitable for generating the upper chip enable signal by selecting one of a plurality of channel enable signals which are sequentially activated, according to the chip ID signal;
- a down scan unit enabled according to the upper chip enable signal, and suitable for performing the down scan by flowing a current downward through the through-electrodes connected in the column direction; and
- an up scan unit enabled according to the upper chip enable signal, and suitable for performing the up scan by flowing a current upward through the through-electrodes connected in the column direction.

20. The stacked semiconductor device of claim 19, wherein the defect detection unit comprises:
- a plurality of sub defect detection units corresponding to the plurality of core dies, sequentially enabled according to the plurality of channel enable signals, and suitable for outputting a plurality of fail determination flags by detecting whether the through-electrodes have a defect, based on the down scan and the up scan; and
- a masking unit suitable for masking the plurality of fail determination flags according to the allocated channel information, and outputting a fail determination signal.

* * * * *